US00RE43503E

(19) United States
(12) Reissued Patent
Kister

(10) Patent Number: US RE43,503 E
(45) Date of Reissued Patent: Jul. 10, 2012

(54) PROBE SKATES FOR ELECTRICAL TESTING OF CONVEX PAD TOPOLOGIES

(75) Inventor: January Kister, Portola Valley, CA (US)

(73) Assignee: MicroProbe, Inc., Carlsbad, CA (US)

(21) Appl. No.: 12/903,566

(22) Filed: Oct. 13, 2010

Related U.S. Patent Documents

Reissue of:
(64) Patent No.: 7,436,192
Issued: Oct. 14, 2008
Appl. No.: 11/701,236
Filed: Jan. 31, 2007

U.S. Applications:
(63) Continuation-in-part of application No. 11/480,302, filed on Jun. 29, 2006, now Pat. No. 7,759,949.

(51) Int. Cl.
*G01R 31/00* (2006.01)
*G01R 31/20* (2006.01)

(52) U.S. Cl. ..... 324/758.01; 324/758.04; 324/754.03; 324/756.04; 324/756.05

(58) Field of Classification Search ..... None
See application file for complete search history.

(56) References Cited

U.S. PATENT DOCUMENTS

| | | | |
|---|---|---|---|
| 3,518,612 | A | 6/1970 | Dunman et al. |
| 3,599,093 | A | 8/1971 | Oates |
| 3,710,251 | A | 1/1973 | Hagge et al. |
| 3,812,311 | A | 5/1974 | Kvaternik |
| 4,027,935 | A | 6/1977 | Byrnes et al. |
| 4,115,736 | A | 9/1978 | Tracy |
| 4,116,523 | A | 9/1978 | Coberly et al. |
| 4,423,376 | A | 12/1983 | Byrnes et al. |
| 4,525,697 | A | 6/1985 | Jones et al. |

(Continued)

FOREIGN PATENT DOCUMENTS

| | | |
|---|---|---|
| DE | 4237591 | 5/1994 |

(Continued)

OTHER PUBLICATIONS

Levy, Larry , "Wafer Probe TM System", *Southwest Test Workshop* Formfactor inc. Jun. 1997 , 1-19.

(Continued)

*Primary Examiner* — Vinh Nguyen
(74) *Attorney, Agent, or Firm* — Deborah A. Peacock; Samantha A. Updegraff; Peacock Myers, P.C.

(57) ABSTRACT

A probe for engaging a conductive pad is provided. The probe includes a probe contact end for receiving a test current, a probe retention portion below the contact end, a block for holding the probe retention portion, a probe arm below the retention portion, a probe contact tip below the arm, and a generally planar self-cleaning skate disposed perpendicular below the contact tip. The self-cleaning skate has a square front, a round back and a flat middle section. The conductive pad is of generally convex shape having a granular non-conductive surface of debris and moves to engage the skate, whereby an overdrive motion is applied to the pad causing the skate to move across and scrub non-conductive debris from the pad displacing the debris along the skate and around the skate round back end to a position on the skate that is away from the pad.

85 Claims, 10 Drawing Sheets

U.S. PATENT DOCUMENTS

| | | | |
|---|---|---|---|
| 4,532,423 | A | 7/1985 | Tojo et al. |
| 4,567,433 | A | 1/1986 | Ohkubo et al. |
| 4,593,961 | A | 6/1986 | Cosmo |
| 4,618,767 | A | 10/1986 | Smith et al. |
| 4,618,821 | A | 10/1986 | Lenz |
| 4,706,019 | A | 11/1987 | Richardson |
| 4,730,158 | A | 3/1988 | Kasai et al. |
| 4,747,698 | A | 5/1988 | Wickramasinghe et al. |
| 4,757,255 | A | 7/1988 | Margozzi |
| 4,772,846 | A | 9/1988 | Reeds |
| 4,773,877 | A | 9/1988 | Kruger et al. |
| 4,807,159 | A | 2/1989 | Komatsu et al. |
| 4,901,013 | A | 2/1990 | Benedetto et al. |
| 4,967,148 | A | 10/1990 | Doemens et al. |
| 5,015,947 | A | 5/1991 | Chism |
| 5,026,291 | A | 6/1991 | David |
| 5,030,318 | A | 7/1991 | Reche |
| 5,061,192 | A | 10/1991 | Chapin et al. |
| 5,067,007 | A | 11/1991 | Kanji et al. |
| 5,145,384 | A | 9/1992 | Asakawa et al. |
| 5,205,739 | A | 4/1993 | Malo et al. |
| 5,207,585 | A | 5/1993 | Byrnes |
| 5,225,771 | A | 7/1993 | Leedy |
| 5,230,632 | A | 7/1993 | Baumberger et al. |
| 5,237,743 | A | 8/1993 | Busacco et al. |
| 5,354,205 | A | 10/1994 | Feigenbaum et al. |
| 5,399,982 | A | 3/1995 | Driller |
| 5,422,574 | A | 6/1995 | Kister |
| 5,430,614 | A | 7/1995 | Difrancesco |
| 5,436,571 | A | 7/1995 | Karasawa |
| 5,476,211 | A | 12/1995 | Khandros |
| 5,531,022 | A | 7/1996 | Beaman et al. |
| 5,576,631 | A | 11/1996 | Stowers et al. |
| 5,632,631 | A | 5/1997 | Fjelstad et al. |
| 5,635,846 | A | 6/1997 | Beaman et al. |
| 5,644,249 | A | 7/1997 | Kister |
| 5,676,599 | A | 10/1997 | Ricks et al. |
| 5,701,085 | A | 12/1997 | Malladi et al. |
| 5,720,098 | A | 2/1998 | Kister |
| 5,742,174 | A | 4/1998 | Kister et al. |
| 5,751,157 | A | 5/1998 | Kister |
| 5,764,070 | A | 6/1998 | Pedder |
| 5,764,072 | A | 6/1998 | Kister |
| 5,764,409 | A | 6/1998 | Colvin |
| 5,767,691 | A | 6/1998 | Verkuil |
| 5,772,451 | A | 6/1998 | Dozier, II et al. |
| 5,773,987 | A | 6/1998 | Montoya |
| 5,802,699 | A | 9/1998 | Fjelstad |
| 5,806,181 | A | 9/1998 | Khandros et al. |
| 5,821,763 | A | 10/1998 | Beamann et al. |
| 5,829,128 | A | 11/1998 | Eldridge et al. |
| 5,832,601 | A | 11/1998 | Eldridge et al. |
| 5,834,946 | A | 11/1998 | Albrow et al. |
| 5,847,936 | A | 12/1998 | Forehand et al. |
| 5,852,871 | A | 12/1998 | Khandros |
| 5,864,946 | A | 2/1999 | Eldridge et al. |
| 5,884,395 | A | 3/1999 | Dabrowiecki et al. |
| 5,892,539 | A | 4/1999 | Colvin |
| 5,914,613 | A | 6/1999 | Gleason et al. |
| 5,917,707 | A | 6/1999 | Khandros et al. |
| 5,923,178 | A | 7/1999 | Higgins et al. |
| 5,926,951 | A | 7/1999 | Khandros et al. |
| 5,932,323 | A | 8/1999 | Throssel |
| 5,934,914 | A | 8/1999 | Fjelstad et al. |
| 5,936,421 | A | 8/1999 | Stowers et al. |
| 5,945,836 | A | 8/1999 | Sayre et al. |
| 5,952,843 | A | 9/1999 | Vinh |
| 5,969,533 | A | 10/1999 | Takagi |
| 5,970,167 | A | 10/1999 | Colvin |
| 5,974,662 | A | 11/1999 | Eldridge et al. |
| 5,994,152 | A | 11/1999 | Khandros et al. |
| 6,027,630 | A | 2/2000 | Cohen |
| 6,029,344 | A | 2/2000 | Khandros et al. |
| 6,031,282 | A | 2/2000 | Jones et al. |
| 6,064,215 | A | 5/2000 | Kister |
| 6,066,957 | A | 5/2000 | Van Loan et al. |
| 6,071,630 | A | 6/2000 | Tomaru et al. |
| 6,086,386 | A | 7/2000 | Fjelstad et al. |
| 6,133,072 | A | 10/2000 | Fjelstad |
| 6,184,576 | B1 | 2/2001 | Jones et al. |
| 6,204,674 | B1 | 3/2001 | Dabrowiecki et al. |
| 6,205,660 | B1 | 3/2001 | Fjelstad et al. |
| 6,215,320 | B1 | 4/2001 | Parrish |
| 6,218,203 | B1 | 4/2001 | Khoury et al. |
| 6,246,245 | B1 | 6/2001 | Akram et al. |
| 6,246,247 | B1 | 6/2001 | Eldridge et al. |
| 6,247,228 | B1 | 6/2001 | Distefano et al. |
| 6,255,126 | B1 | 7/2001 | Mathieu et al. |
| 6,259,261 | B1 | 7/2001 | Engelking et al. |
| 6,278,284 | B1 | 8/2001 | Mori et al. |
| 6,292,003 | B1 | 9/2001 | Fredrickson et al. |
| 6,334,247 | B1 | 1/2002 | Beaman et al. |
| 6,336,269 | B1 | 1/2002 | Eldridge et al. |
| 6,344,753 | B1 | 2/2002 | Takada et al. |
| 6,411,112 | B1 | 6/2002 | Das et al. |
| 6,419,500 | B1 | 7/2002 | Kister |
| 6,420,887 | B1 | 7/2002 | Kister et al. |
| 6,424,164 | B1 | 7/2002 | Kister |
| 6,433,571 | B1 | 8/2002 | Montoya |
| 6,437,584 | B1 | 8/2002 | Gleason et al. |
| 6,441,315 | B1 | 8/2002 | Eldridge et al. |
| 6,443,784 | B1 | 9/2002 | Kimoto |
| 6,482,013 | B2 | 11/2002 | Eldridge et al. |
| 6,483,328 | B1 | 11/2002 | Eldridge et al. |
| 6,486,689 | B1 | 11/2002 | Nishikawa |
| 6,525,552 | B2 | 2/2003 | Kister |
| 6,529,021 | B1 | 3/2003 | Yu et al. |
| 6,530,148 | B1 | 3/2003 | Kister |
| 6,566,898 | B2 | 5/2003 | Theissen et al. |
| 6,570,396 | B1 | 5/2003 | Kister |
| 6,573,738 | B1 | 6/2003 | Matsuo et al. |
| 6,575,767 | B2 | 6/2003 | Satoh et al. |
| 6,576,485 | B2 | 6/2003 | Zhou et al. |
| 6,586,955 | B2 | 7/2003 | Fjelstad et al. |
| 6,615,485 | B2 | 9/2003 | Eldridge et al. |
| 6,624,648 | B2 | 9/2003 | Eldridge et al. |
| 6,633,176 | B2 * | 10/2003 | Takemoto et al. ..... 324/755.01 |
| 6,641,430 | B2 | 11/2003 | Zhou et al. |
| 6,646,455 | B2 | 11/2003 | Maekawa et al. |
| 6,676,438 | B2 | 1/2004 | Zhou et al. |
| 6,677,245 | B2 | 1/2004 | Zhou et al. |
| 6,690,185 | B1 | 2/2004 | Khandros et al. |
| 6,707,311 | B2 | 3/2004 | Hohenwarter |
| 6,727,719 | B2 | 4/2004 | Liao et al. |
| 6,731,123 | B2 | 5/2004 | Kimoto |
| 6,765,228 | B2 | 7/2004 | Lin et al. |
| 6,825,422 | B2 | 11/2004 | Eldridge et al. |
| 6,842,023 | B2 | 1/2005 | Yoshida et al. |
| 6,847,221 | B2 | 1/2005 | Kimoto et al. |
| 6,853,208 | B2 | 2/2005 | Okubo et al. |
| 6,881,974 | B2 | 4/2005 | Wood et al. |
| 6,890,185 | B1 | 5/2005 | Kister et al. |
| 6,897,666 | B2 | 5/2005 | Swettlen et al. |
| D507,198 | S | 7/2005 | Kister |
| 6,917,102 | B2 | 7/2005 | Zhou et al. |
| 6,917,525 | B2 | 7/2005 | Mok et al. |
| D510,043 | S | 9/2005 | Kister |
| 6,945,827 | B2 | 9/2005 | Grube et al. |
| 6,956,389 | B1 | 10/2005 | Mai |
| 6,965,244 | B2 | 11/2005 | Miller |
| 6,965,245 | B2 | 11/2005 | Kister et al. |
| 6,970,005 | B2 | 11/2005 | Rincon et al. |
| 7,015,707 | B2 | 3/2006 | Cherian |
| 7,046,021 | B2 | 5/2006 | Kister |
| 7,059,865 | B2 | 6/2006 | Kister et al. |
| 7,064,564 | B2 | 6/2006 | Kister et al. |
| D525,207 | S | 7/2006 | Kister et al. |
| 7,071,715 | B2 | 7/2006 | Shinde et al. |
| 7,073,254 | B2 | 7/2006 | Eldridge et al. |
| 7,078,921 | B2 | 7/2006 | Haga et al. |
| 7,088,118 | B2 | 8/2006 | Liu et al. |
| 7,091,729 | B2 | 8/2006 | Kister |
| 7,108,546 | B2 | 9/2006 | Miller et al. |
| 7,109,731 | B2 | 9/2006 | Gleason et al. |
| 7,126,361 | B1 | 10/2006 | Anderson et al. |
| 7,148,709 | B2 | 12/2006 | Kister |
| 7,150,658 | B1 | 12/2006 | Chien |

| | | | |
|---|---|---|---|
| 7,173,441 | B2 | 2/2007 | Kister et al. |
| 7,189,078 | B2 | 3/2007 | Kister et al. |
| 7,202,682 | B2 | 4/2007 | Cooper et al. |
| 7,217,138 | B2 | 5/2007 | Kister et al. |
| 7,218,127 | B2 | 5/2007 | Cooper et al. |
| 7,218,131 | B2 | 5/2007 | Tanioka et al. |
| 7,225,538 | B2 | 6/2007 | Eldridge et al. |
| 7,227,371 | B2 | 6/2007 | Miller |
| 7,265,565 | B2 | 9/2007 | Chen et al. |
| 7,274,195 | B2 | 9/2007 | Takemoto et al. |
| 7,285,966 | B2 | 10/2007 | Lee et al. |
| 7,312,617 | B2 | 12/2007 | Kister |
| 7,345,492 | B2 | 3/2008 | Kister |
| 7,417,447 | B2 | 8/2008 | Kister |
| 7,436,192 | B2 | 10/2008 | Kister |
| 7,511,523 | B2 | 3/2009 | Chen et al. |
| 7,514,948 | B2 | 4/2009 | Kister |
| 7,649,367 | B2 | 1/2010 | Kister |
| 7,659,739 | B2 | 2/2010 | Kister |
| 7,671,610 | B2 | 3/2010 | Kister |
| 7,759,949 | B2 | 7/2010 | Kister |
| 7,786,740 | B2 | 8/2010 | Kister |
| 2001/0012739 | A1 | 8/2001 | Grube et al. |
| 2001/0040460 | A1 | 11/2001 | Beaman et al. |
| 2002/0070743 | A1 | 6/2002 | Felici et al. |
| 2002/0125584 | A1 | 9/2002 | Umehara et al. |
| 2002/0153913 | A1 | 10/2002 | Okubo et al. |
| 2002/0190738 | A1 | 12/2002 | Beaman et al. |
| 2002/0194730 | A1 | 12/2002 | Shih et al. |
| 2003/0027423 | A1 | 2/2003 | Zhou |
| 2003/0116346 | A1 | 6/2003 | Forster et al. |
| 2004/0036493 | A1 | 2/2004 | Miller |
| 2004/0046579 | A1 | 3/2004 | Chraft et al. |
| 2004/0104737 | A1 | 6/2004 | Haga et al. |
| 2004/0119485 | A1 | 6/2004 | Koch et al. |
| 2004/0239352 | A1 | 12/2004 | Mizoguchi |
| 2005/0012513 | A1 | 1/2005 | Cheng et al. |
| 2005/0179458 | A1 | 8/2005 | Chen et al. |
| 2005/0184743 | A1 | 8/2005 | Kimura |
| 2005/0189955 | A1 | 9/2005 | Takemoto et al. |
| 2006/0033516 | A1 | 2/2006 | Rincon et al. |
| 2006/0040417 | A1 | 2/2006 | Eldridge et al. |
| 2006/0073712 | A1 | 4/2006 | Suhir |
| 2006/0082380 | A1 | 4/2006 | Tanioka et al. |
| 2006/0170440 | A1 | 8/2006 | Sudin |
| 2006/0171425 | A1 | 8/2006 | Lee et al. |
| 2007/0145989 | A1 | 6/2007 | Zhu et al. |
| 2007/0167022 | A1 | 7/2007 | Tsai et al. |
| 2007/0229103 | A1 | 10/2007 | Tani |
| 2008/0074132 | A1 | 3/2008 | Fan et al. |
| 2008/0088331 | A1 | 4/2008 | Yoshida |
| 2008/0258746 | A1 | 10/2008 | Tran et al. |
| 2009/0201041 | A1 | 8/2009 | Kister |
| 2010/0109691 | A1 | 5/2010 | Kister |
| 2010/0176832 | A1 | 7/2010 | Kister |
| 2010/0182030 | A1 | 7/2010 | Kister |
| 2010/0182031 | A1 | 7/2010 | Kister |
| 2010/0289512 | A1 | 11/2010 | Kister |
| 2011/0006796 | A1 | 1/2011 | Kister |
| 2011/0062978 | A1 | 3/2011 | Kister |
| 2011/0273198 | A1 | 11/2011 | Kister |
| 2011/0273199 | A1 | 11/2011 | Kister |

FOREIGN PATENT DOCUMENTS

| | | | |
|---|---|---|---|
| EP | 0144682 | | 6/1985 |
| EP | 0764352 | | 5/2004 |
| JP | 63-307678 | | 12/1988 |
| JP | 01128535 A | * | 5/1989 |
| JP | 7-021968 | | 1/1995 |
| JP | 7-333232 | | 12/1995 |
| JP | 10-506238 | | 6/1998 |
| JP | 10-221374 | | 8/1998 |
| JP | 10311864 | | 11/1998 |
| JP | 11044727 | | 2/1999 |
| TW | 201109669 | | 3/2011 |
| WO | WO 8704568 | | 7/1987 |
| WO | WO092/10010 | | 6/1992 |
| WO | WO 96/15458 | | 5/1996 |
| WO | WO 96/37332 | | 11/1996 |
| WO | WO9743653 | | 11/1997 |
| WO | WO00/54066 | | 9/2000 |
| WO | WO01/09623 | | 2/2001 |

OTHER PUBLICATIONS

Sporck, Nicholas , "A New Probe Card Technology Using Compliant Microsprings", *Proceedings 1997 IEEE International Test Conference* Nov. 1, 1997 , 527-532.

Bennett, Scott et al. "Precision Point Probe Card Analyzers: Probe Force," pp. 1-4, 2003. Applied Precision. www.appliedprecision.com.

Broz, Jerry J. et al. "Controlling Contact Resistance," pp. 1-4, May 2004. EE-Evaluation Engineering. www.evaluationengineering.com.

Stalnaker, Scott et al. "SWTW2003: Controlling Contact Resistance with Probe Tip Shape & Cleaning Recipe Optimization," pp. 1-31, Jun. 1-4, 2003. Southwest Test Workshop, Long Beach, CA.

Dabrowiecki, Krzysztof R&D Group. "Advances in Conventional Cantilever Probe Card," pp. 1-28, Jun. 6-9, 1999. Southwest Test Workshop, San Diego, CA.

Tunaboylu, Bahadir et al. "SWTW2003: Vertical Probe Development for Copper Bump Test Challenges,"pp. 1-26. Jun. 2, 2003. Southwest Test Workshop, Long Beach CA.

* cited by examiner

PROBE SKATES FOR ELECTRICAL TESTING OF CONVEX PAD TOPOLOGIES

Matter enclosed in heavy brackets [ ] appears in the original patent but forms no part of this reissue specification; matter printed in italics indicates the additions made by reissue.

CROSS-REFERENCE TO RELATED APPLICATIONS

This application is a continuation-in-part application of the inventor's prior U.S. application Ser. No. 11/480,302 filed Jun. 29, 2006, for PROBES WITH SELF-CLEANING SKATES FOR CONTACTING CONDUCTIVE PADS, which claims the benefit of U.S. application Ser. No. 10/850,921 filed on May 21, 2004, now U.S. Pat. No. 7,148,709, U.S. application Ser. No. 10/888,347 filed on Jul. 9, 2004 and U.S. application Ser. No. 11/450,977 filed on Jun. 9, 2006.

FIELD OF THE INVENTION

The invention relates generally to an apparatus and method of using contacting tips of probes in scrubbing and electrical testing of a device under test. More particularly, the invention relates to an apparatus and method of using contacting tips having probe skates with geometries that provide self-cleaning and a reduction in sensitivity to overdrive motion.

BACKGROUND

Semiconductor wafer testing before dicing is a necessary and critical process step. Such testing provides early verification of circuit design and fabrication integrity. Typically, test probes are placed in contact with conductive pads of a device under test (DUT) to provide a test signal for such verification of the circuit, where the conductive pads are positioned on the surface of a wafer or DUT. These pads are known to have bump-like or convex shape, with the base of the pad incorporated into the wafer surface. A problem exists with a non-conductive layer of debris on the pad such as a non-conductive oxide layer impeding the conductive pad from receiving the test signal, where the debris is an artifact of the fabrication process. Currently, a scrubbing method is used to remove some of the non-conductive layer from the pads before applying the test signal. Many methods exist for removing the debris layer such as using the probe tip itself to scrub the pad while applying the test signal. For information about corresponding probe designs and scrub motion mechanics the reader is referred to U.S. Pat. No. 5,436,571 to Karasawa; U.S. Pat. Nos. 5,773,987 and 6,433,571 both to Montoya; U.S. Pat. No. 5,932,323 to Throssel and U.S. Appl. 2006/0082380 to Tanioka et al. Additional information about the probe-oxide semiconductor interface is found in U.S. Pat. No. 5,767,691 to Verkuil.

The scrub motion includes engaging a probe tip with a conductive pad, and applying an overdrive motion to the pad to cause the probe to scrub the layer of debris from the pad. Numerous problems arise from this method such as controlling the probe scrubbing action, managing undesirable debris accumulation on the probe tip, and the added need for a complicated and invasive probe cleaning processes to remove the debris from the probe tips. Consistent scrub control is of paramount importance. A probe is often too sensitive to the overdrive motion from the pad, causing a scrub depth that is too deep that not only removes a portion of the non-conductive layer, but also damages or breaches the conductive pad, thus rendering the wafer unusable. Debris accumulation on the probe tip degrades the electrical continuity between the probe and conductive pad, often times restricting the test signal and providing erroneous test results, where implementation of an undesirable test redundancy may then become necessary. Complicated probe tip cleaning methods, such as use of abrasion cleaning, have been used to remove debris from the probe tip by scouring. Such a technique not only disrupts the fabrication throughput, but also degrades the probe tip, resulting in shortened utility of the probes and requiring premature replacement.

Current attempts to address these issues have been met with shortcomings, where in one case a contact bump at the end of a probe has a nub made from rhodium nickel alloy fused to the contact bump. While such an alloy lends itself for creating a tip that is more robust for scrubbing, the need to disrupt fabrication throughput for a probe tip cleaning process still exists. Further, the geometry of the contact bump made from the alloy nub lends itself for undesirable accumulation of debris, thus necessitating relatively frequent cleaning. Another attempt has been implemented that includes a knife-like probe end in an effort to reduce debris accumulation for limiting the need for abrasive cleaning. Unfortunately, such geometry has been shown to lack scrubbing control and damage the pad due to the probe having a hypersensitivity to overdrive motion. For additional information about probe tip geometries the reader is referred to U.S. Pat. No. 6,633,176 and U.S. Appl. 2005/0189955 both to Takemoto et al., and U.S. Pat. No. 6,842,023 to Yoshida et al. employs contact probe whose tip tapers to a sloping blade or chisel.

It would be considered an advance in the art to provide a probe design having a probe tip with a self-cleaning skate that alleviates the need for using abrasion techniques to remove debris from the probe tip. A method of using a self-cleaning probe tip is needed that provides effective scrubbing for enabling testing. Further needed is a probe having a self-cleaning skate that is less sensitive to overdrive motion to enable consistent and predictable scrubbing for more reliable wafer testing and to alleviate the need for test redundancies.

SUMMARY OF THE INVENTION

The present invention provides a probe having a self-cleaning tip, or skate, for engaging a conductive pad. The probe includes a contact end for receiving a test current, a probe retention portion below the contact end and a block for holding the retention portion. Further, a probe arm below the retention portion has a probe contact tip there below and a generally planar self-cleaning skate disposed perpendicular below the contact tip. The self-cleaning skate has a generally square front end, a generally round back end and a generally flat middle section therebetween.

In one embodiment of the invention, the skate has a skate height up to ½ of the skate length and a skate width up to ⅙ of the skate length. In one aspect of the current invention, the self-cleaning skate width is narrower than a width of the contacting tip. In another aspect of the invention, the skate may have different cross-sections such as a U-shape, a semicircular shape, a V-shape, box-shape, or a parallelogram-shape, where the parallelogram cross-section has a first parallel side connected to the bottom of the contact tip and a second parallel side for contacting the conductive pad, whereby the first parallel side is larger than the second parallel side. Further, the box-shape cross-section has a first horizontal side connected to the bottom of the contact tip and a second horizontal side for contacting the conductive pad, where the second horizontal side further includes radii at each edge of the second horizontal side. According to the embodiments of the current invention, the self-cleaning skate length is aligned along a scrub direction.

The conductive pad is generally convex and has a granular non-conductive surface layer of debris such as a non-conductive oxidation surface. The pad is moved to engage the skate. Once engaged, an overdrive motion is applied to the conductive pad causing the probe to flex and move the skate across the conductive pad to scrub debris from the pad. The scrubbed debris is displace along the skate and moved around the skate round back end to a position on the skate that is away from the conductive pad. In one aspect of the invention, the probe arm has a base arm below the retention portion, a knee below the base arm, and a reverse arm below the knee. Further, a contact tip is below the reverse arm and the self-cleaning skate is below the contact tip.

In one embodiment of the invention, the skate round back end has a radius with a size as large as the length of the skate height. In another embodiment of the invention, the round back end of the skate is a variable radius back end.

In one aspect of the invention, the overdrive motion causes the skate to pivot such that the middle section forms an angle up to 35 degrees with respect to a horizontal plane, while the round back end remains engaged with the conductive pad. Reversing the overdrive motion causes the skate to reverse its movement, where the skate moves from an up angle to approximately a horizontal position while maintaining engagement with the conductive pad. Here, the skate translates along the horizontal position in a direction towards the skate back end, where the debris is further displaced along the round back end and away from the conductive pad. Finally, the conductive pad moves away from the skate to disengage the probe from the conductive pad.

In one aspect of the invention, the pad is in an extended overdrive motion beyond the previous overdrive motion, causing the probe move in a manner to further displace the debris away from the conductive pad. Here, the extended overdrive motion is applied after at least two touch down cycles. Such overdrive motion of the conductive pad is between 1-5 mil.

As an advancement in removing the debris from the skate, in one aspect of the invention, the conductive pads for engaging the probe tip are replaced by a cleaning sheet having debris adhesion properties for removing the debris from the skate.

One aspect of the present invention is a method of using the self-cleaning skate by providing a conductive pad having a generally convex shape and a non-conductive layer of debris, such as a granular non-conductive oxidation surface, and providing a conductive probe for engaging the conductive pad. The probe includes a contact end for receiving a test current, a retention portion below the contact end, a block for holding the retention portion, a probe arm below the retention portion, a probe contact tip below the arm, and a generally planar self-cleaning skate disposed perpendicular below the contact tip, where the skate has a generally square front end, a generally round back end and a generally flat middle section therebetween. The skate is positioned above the conductive pad, where the conductive pad is translated, causing the skate to engage the conductive pad. Overdrive motion is then provided to the conductive pad causing the skate to scrub the debris from the conductive pad and clean the debris from the region of the skate that contacts the conductive pad. The cleaning occurs from the overdrive motion moving the skate to form an angle between the skate middle section and a horizontal plane, while engaging the round back end with the conductive pad. The overdrive motion induces a translation motion of the skate back end along the pad in a direction towards the skate front end while the skate middle section is further angled with respect to the horizontal plane. As the skate back end translates across the conductive pad, debris and non-conductive oxides are displaced along the skate, where the debris moves around the round back end to a position on the skate that is away from the conductive pad. Reversing the overdrive motion to the pad causes the skate middle section to move from the angle to approximately the horizontal position, where the skate flat middle section is in contact with the conductive pad. Here, the debris on the skate back end moves to a position away from the conductive pad. Continuing to reverse the overdrive motion translates the skate along the horizontal position and further moving the debris around the round back end to a position on the skate that is away from the conductive pad. Finally, the pad is translated to cause the probe to disengage from the conductive pad. The method according to the current invention improves overdrive control by making the scrubbing and cleaning less sensitive to the overdrive motion, where the debris layer is removed without breaching or damaging the conductive pad and debris is displaced from the conductive pad to the skate. Further, a current (i) is applied to the probe after the self-cleaning skate contacts the conductive pad. Using the self-cleaning skate according to the invention is accomplished after at least two engagement cycles.

In one aspect of the method according to the current invention, the probe arm includes a base arm below the retention portion, a knee below the base arm, and a reverse arm below the knee, where the contact tip is below the reverse arm and the self-cleaning skate is below the contact tip.

In another aspect of the invention, the self-cleaning skate is positioned above the pad by disposing an approximate center location of the flat middle end above an edge of the conductive pad, where the skate engages the conductive pad with the center of the skate positioned on the conductive pad edge.

Some key advantages of the invention are the features of the self-cleaning skate extend the mean time between failure of the probe caused by debris buildup on the skate. Additionally, due to the unique skate design, a scrub channel may be made on irregularly shaped conductive pads at any location on the pad. The current invention provides better control of the skate during overdrive motion, where improved tolerance to overdrive motion enables reliable pad testing on silicon wafers before dicing.

BRIEF DESCRIPTION OF THE FIGURES

The objectives and advantages of the present invention will be understood by reading the following detailed description in conjunction with the drawings, in which.

DETAILED DESCRIPTION OF THE INVENTION

Figure 1:
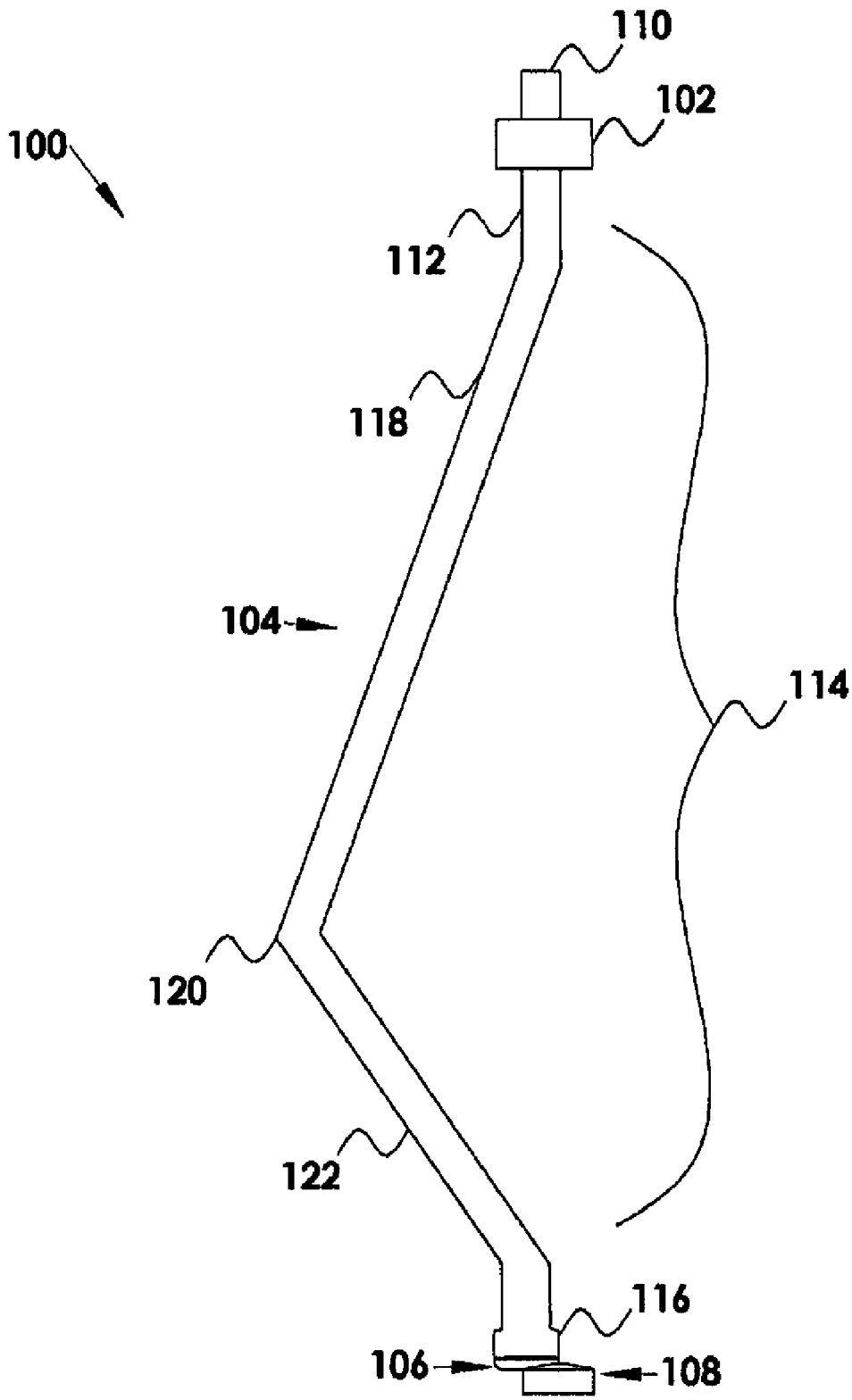
FIG. 1 shows a planar view of a block holding a probe having a self-cleaning skate engaging a conductive pad according to the present invention.

Although the following detailed description contains many specifics for the purposes of illustration, anyone of ordinary skill in the art will readily appreciate that many variations and alterations to the following exemplary details are within the scope of the invention. Accordingly, the following preferred embodiment of the invention is set forth without any loss of generality to, and without imposing limitations upon, the claimed invention.

Semiconductor wafer processing methods and technology have been dynamic fields and continue to be the focus of much research and development. Among the numerous areas of these fields, early verification of process integrity and circuit design is an important step for effective cost control and manufacturing efficiency. As new methods of fabrication and new semiconductor wafer features evolve, testing methods must adapt to these changes. For example, the conductive pad of a semiconductor wafer can be fabricated as a dome-shape, or even a pedestal having a dome-shape located at the pedestal top, where the dome feature may be non-uniform and asymmetric. New methods of testing and new conductive test probes are required to address these evolving fabrication technologies. Typically, the conductive pad has a non-conductive layer of debris that includes a non-conductive oxide layer on the dome surface that impedes electrical contact between the probe tip and the conductive pad. In the testing phase, this layer requires a scrubbing step to remove some of the non-conductive layer of debris to enable electrical contact between the conductive pad and the probe tip. It is desirable to remove this layer and apply a test current to the pad to verify circuit design and fabrication integrity, while simultaneously controlling the probe tip position on the pad and cleaning the probe end. In the current invention, the scrubbing process requires the conductive pad to be positioned below the probe tip and then moved to make contact with the probe tip. Once engaged, an overdrive motion is applied to the conductive pad whereby the probe flexes to allow the probe tip to traverse the conductive pad and scrub the non-conductive layer of debris from the pad surface while applying a test current (i) through the probe. Problems arise when scrubbing and testing the dome-shaped conductive pads. These problems include controlling the probe tip to ensure it remains on the conductive pad during scrubbing and testing, ensuring the translation of the probe tip across the pad is not too sensitive to the overdrive motion, and managing the debris that is removed to ensure electrical continuity and prevent or limit accumulation of debris on the probe tip.

To address these issues, the present invention provides a probe having a self-cleaning tip, or skate, for engaging a conductive pad of the semiconductor wafer, where the conductive pad may have a dome-shape or be a pedestal having a dome-shape. The probe includes a contact end for receiving a test current, a probe retention portion below the contact end and a block for holding the retention portion. Further, a probe arm below the retention portion has a probe contact tip there below and a generally planar self-cleaning skate disposed perpendicular below the contact tip. The self-cleaning skate has a generally square front end, a generally round back end and a generally flat middle section therebetween. This configuration may be made into an array of probes suited for scrubbing and testing semiconductor wafers having many conductive pads arranged according to a circuit, or multiple circuits, integrated to the wafer.

The skate of the probe contacting tip may have a height up to ½ of the skate length and a skate width up to ⅙ of the skate length. Additionally, the self-cleaning skate may have a width that is generally narrower than a width of the contacting tip. These skates may have a cross-section such as a U-shape, semi-circular shape, V-shape, box-shape, and parallelogram-shape, where the parallelogram cross-section has a first parallel side connected to the bottom of the contact tip and a second parallel side for contacting the conductive pad, whereby the first parallel side is larger than the second parallel side. Further, the box-shape cross-section may have a first horizontal side connected to the contact tip and a second horizontal side for contacting the conductive pad, where the second horizontal side further includes radii at each edge of the second horizontal side. In these aspects, the self-cleaning skate length is aligned along a scrub direction.

One conductive pad addressed in the current invention is generally convex having a non-conductive layer, such as a granular non-conductive oxidation layer, that is an artifact of the wafer fabrication process. The conductive pad is moved to engage the skate. Once engaged, an overdrive motion is applied to the conductive pad causing the probe arm to flex. This flexing allows the skate to remain in contact with the conductive pad while moving across the pad to scrub the non-conductive layer of debris and remove the debris from the conductive pad. An intended consequence of the skate design according to the current invention, is the scrubbed debris is displaced along the skate and moved around the skate round back end to a position on the skate that is away from said conductive pad.

In one aspect of the invention, to enable further control of the skate as the pad is subject to the overdrive motion, the probe arm has a base arm below the retention portion, a knee below the base arm, and a reverse arm below the knee. Further, the contact tip is below the reverse arm and the self-cleaning skate is below the contact tip.

According to the design of the self-cleaning skate, the skate round back end has a radius with a size up to the length of the skate height. Alternatively, the round back end of the skate may be a variable radius, or multiple radii, back end.

According to the aspects of the invention, the overdrive motion causes the skate to pivot such that the middle section forms an angle up to 35 degrees with respect to a horizontal plane, while the round back end is engaged with the conductive pad. Further, by reversing the overdrive motion, the skate moves in a reverse direction across the conductive pad, where the skate moves from an up angle to approximately a horizontal position while engaging the conductive pad. Here, the skate translates along the horizontal position in a direction towards the skate back end, where the debris is further displaced along the round back end and away from the conductive pad. Finally, the conductive pad moves away from the skate to disengage the probe from the conductive pad, whereby a scrub channel is evident on the surface of the pad.

In one aspect of the invention, the pad is extended in an overdrive motion that is beyond the previous overdrive motion, the probe is caused to move in a manner that further displaces the already displaced debris away from the conductive pad. Here, the extended overdrive motion is applied after at least two touch down cycles. Such overdrive motion of the conductive pad may be between 1-5 mil.

Prior to the current invention, a separate process was required for removing accumulated debris from probes, such as scouring or buffing the probe ends. This added step is known to be invasive to the fabrication process, where in addition to a need for a separate mechanical configuration in the fabrication process, the probes are subject to additional ware from abrasion that shortens their utility. As an advancement in removing the debris from the skate, in one aspect of the invention, the conductive pads are replaced by a cleaning sheet having debris adhesion properties for removing the debris from the skate.

A method of using the self-cleaning skate according to the current invention includes providing the conductive pad having with the generally convex shape and a non-conductive layer, such as a granular oxidation surface, and providing a conductive probe for engaging the conductive pad that includes a contact end for receiving a test current, a retention portion below the contact end, a block for holding the retention portion, a probe arm below the retention portion, a probe contact tip below the arm, and a generally planar self-cleaning skate disposed perpendicularly below the contact tip, where the skate has a generally square front end, a generally round back end and a generally flat middle section therebetween. The skate is positioned above the conductive pad, where the conductive pad is translated causing the skate to engage the conductive pad. Overdrive motion is provided to the conductive pad causing the skate to scrub the non-conductive layer of debris and remove it from the conductive pad and then clean the debris from the skate. The cleaning occurs by the overdrive motion flexing the probe and causing the skate to move across the pad to form an angle of the skate middle section with respect to a horizontal plane while still engaging the round back end with the conductive pad. The overdrive motion induces translation motion of the skate back end in a direction towards the skate front end across the conductive pad while the skate middle section is further angled with respect to the horizontal plane. As the skate back end translates across the conductive pad, debris, such as a non-conductive oxide, is displaced along the skate, where the debris moves around the round back end to a position on the skate that is away from the conductive pad. Reversing the overdrive motion to the pad causes the skate middle section to move from the angle to approximately the horizontal position, where the skate flat middle section is in contact with the conductive pad. Here, the debris on the skate back end moves to a position away from the conductive pad. Continuing to reverse the overdrive motion of the conductive pad translates the skate along the horizontal position and further moves the debris around the round back end to a position on the skate that is away from the conductive pad. Finally, the pad is translated to cause the probe to disengage from the conductive pad. The method according to the current invention improves overdrive control by making the scrubbing and cleaning less sensitive to the overdrive motion, where the oxidation layer is removed without breaching the conductive pad and debris is displaced from the conductive pad to the skate. Accordingly, a current (i) is applied after said self-cleaning skate contacts the conductive pad.

Using the self-cleaning skate according to the invention is accomplished after at least two said engagement cycles.

In one aspect of the current invention, the probe arm includes a base arm below the retention portion, a knee below the base arm, and a reverse arm below the knee, where the contact tip is below the reverse arm and the self-cleaning skate is below the contact tip.

In another aspect of the invention, the self-cleaning skate is positioned above the pad by disposing an approximate center location of the flat middle end above an edge of the conductive pad, where the skate to engages the conductive pad with the center of the skate positioned on the conductive pad edge.

Referring now to the figures, FIG. 1 is a planar view of a scrubbing system 100 that includes a block 102 holding a probe 104 having a self-cleaning skate 106 for engaging a conductive pad 108 to scrub debris (see FIG. 2) from the conductive pad 108 while applying the test current (i), according to the present invention. The probe includes a contact end 110 for receiving the test current (i) (not shown), a probe retention portion 112, below the contact end, that is held by the block 102. A probe arm 114 below the retention portion 112 has a probe contact tip 116 at the end, with a generally planar self-cleaning skate 106 disposed perpendicular below the contact tip 116. According to one embodiment of the invention and depicted in FIG. 1, the probe arm 114 has a base arm 118 below the retention portion, a knee 120 below the base arm 118, and a reverse arm 122 below the knee 120, where the contact tip 116 is below the reverse arm 122 and the self-cleaning skate 106 is below the contact tip 116.

Figure 2:
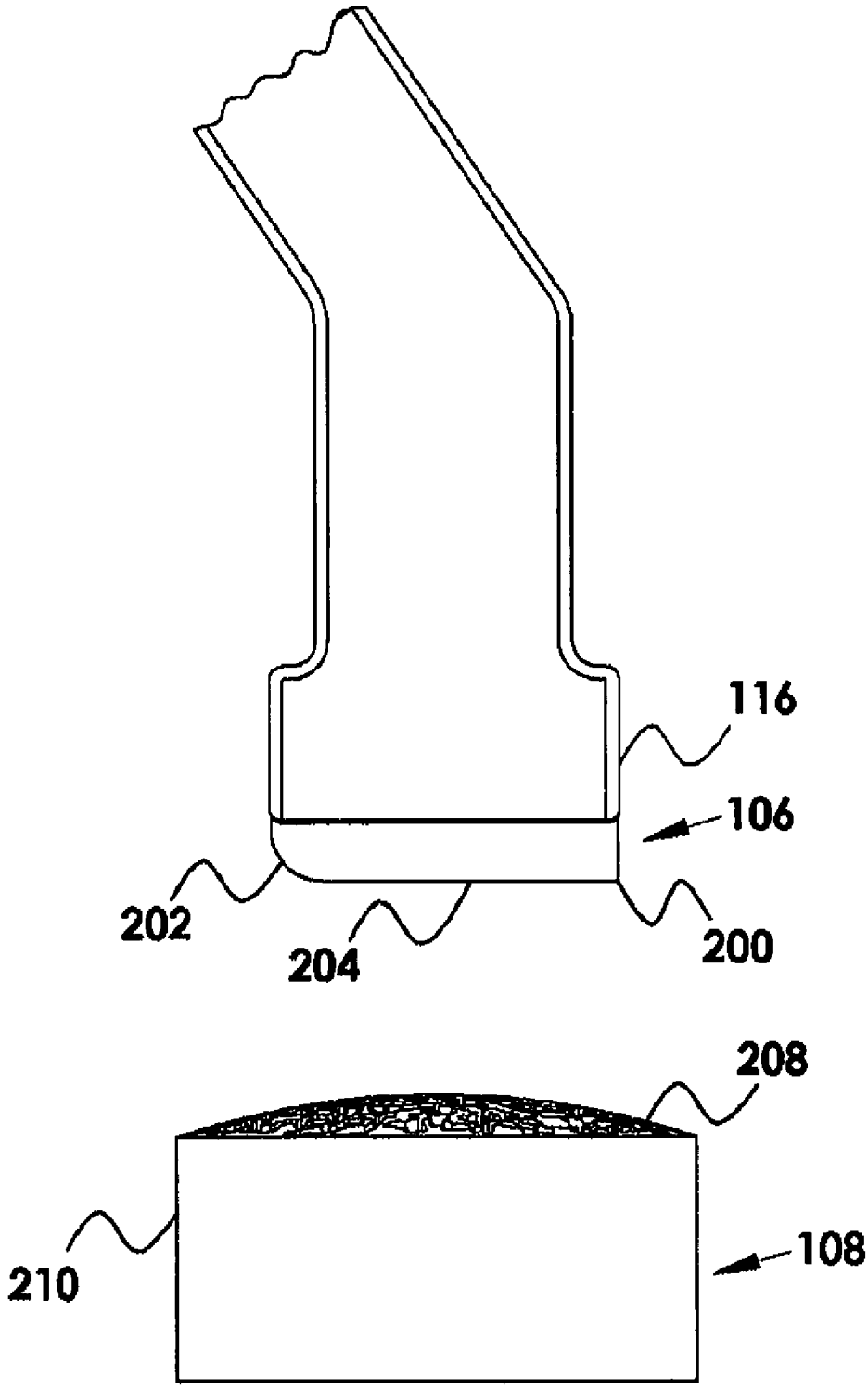
FIG. 2 shows a planar view of a probe tip having a self-cleaning skate that is positioned over a conductive pad according to the present invention.

Illustrated in FIG. 2 is a planar view of the probe tip 116 having the self-cleaning skate 106 positioned over a conductive pad 108 according to one embodiment of the present invention. Here, the self-cleaning skate 106 depicted is generally planar and disposed perpendicular below the contact tip 116, where the skate 106 has a generally square front end 200, a generally round back end 202 and a generally flat middle section 204 therebetween. Further depicted, the conductive pad 108 has a layer of non-conductive granular debris 208 formed in a generally convex shape on a generally cylindrical base 210, where the non-conductive granular debris 208 can be a non-conductive oxide layer resulting from a breakdown of the surface of the metallic conductive pad in the fabrication processes.

Figure 3:
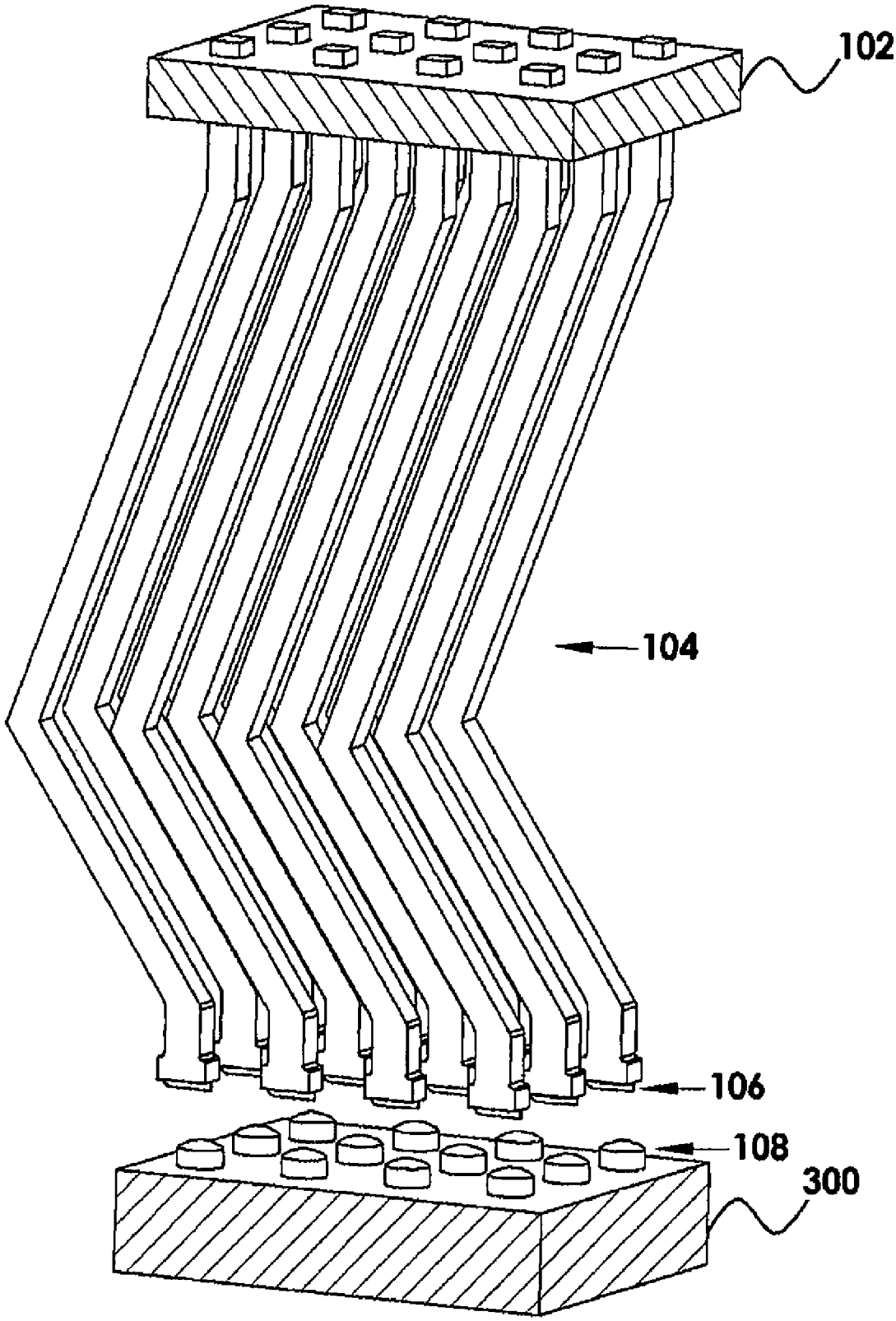
FIG. 3 shows a perspective view of a block holding multiple probes with self-cleaning skates positioned over multiple conductive pads according to the present invention.

FIG. 3 depicts a perspective view of the block 102 holding multiple probes 104 with self-cleaning skates 106 positioned over multiple conductive pads 108 according to one embodiment of the present invention. The conductive pads 108 are embedded into a semiconductor wafer 300, where the wafer 300 and pads 108 are driven upwards to cause the conductive pads 108 to engage the self-cleaning skates 106 for scrubbing and testing as will be described below.

Figure 4:
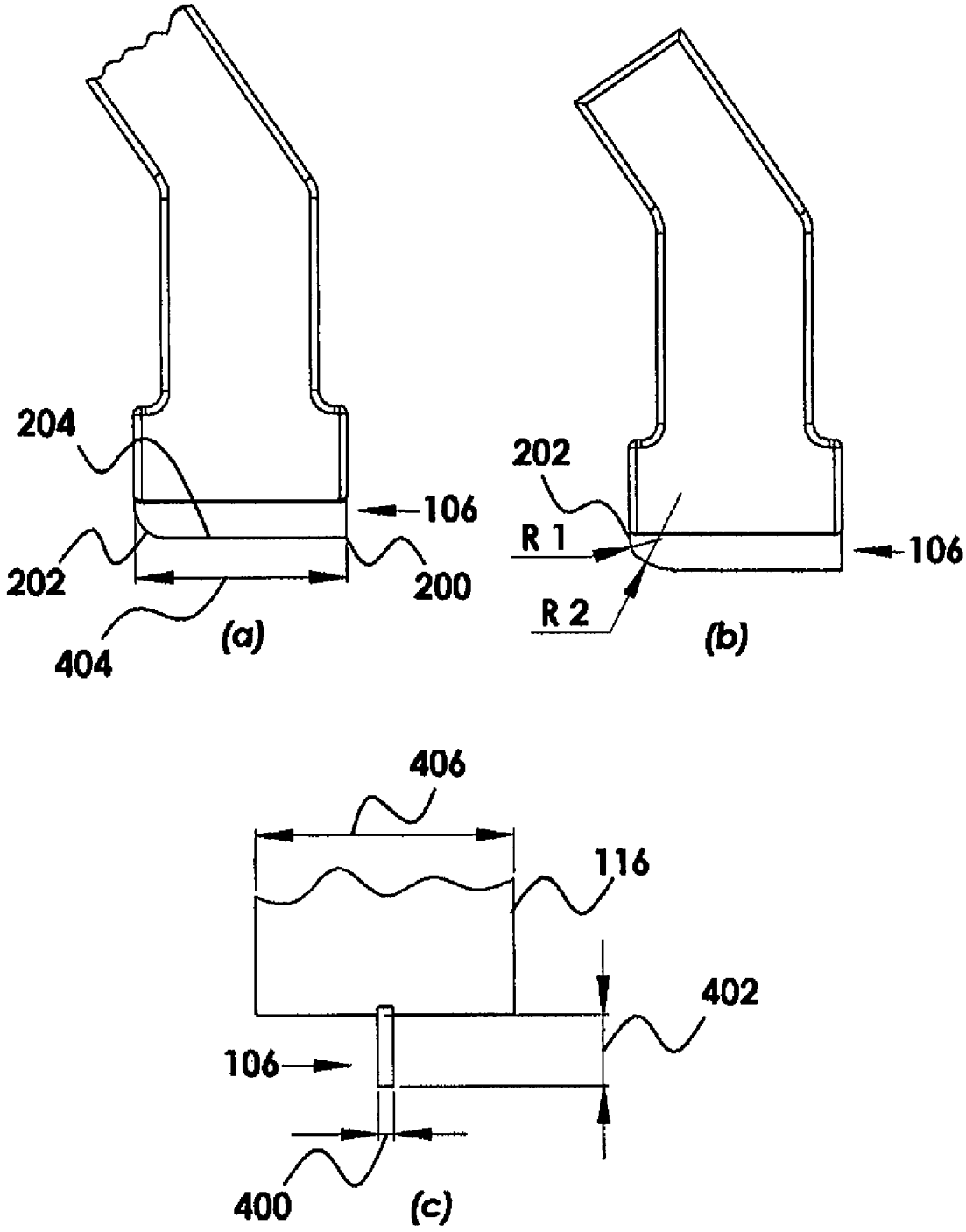
FIGS. 4a-4c show planar views of some embodiments of the self-cleaning skate according to the present invention.
Figure 5:
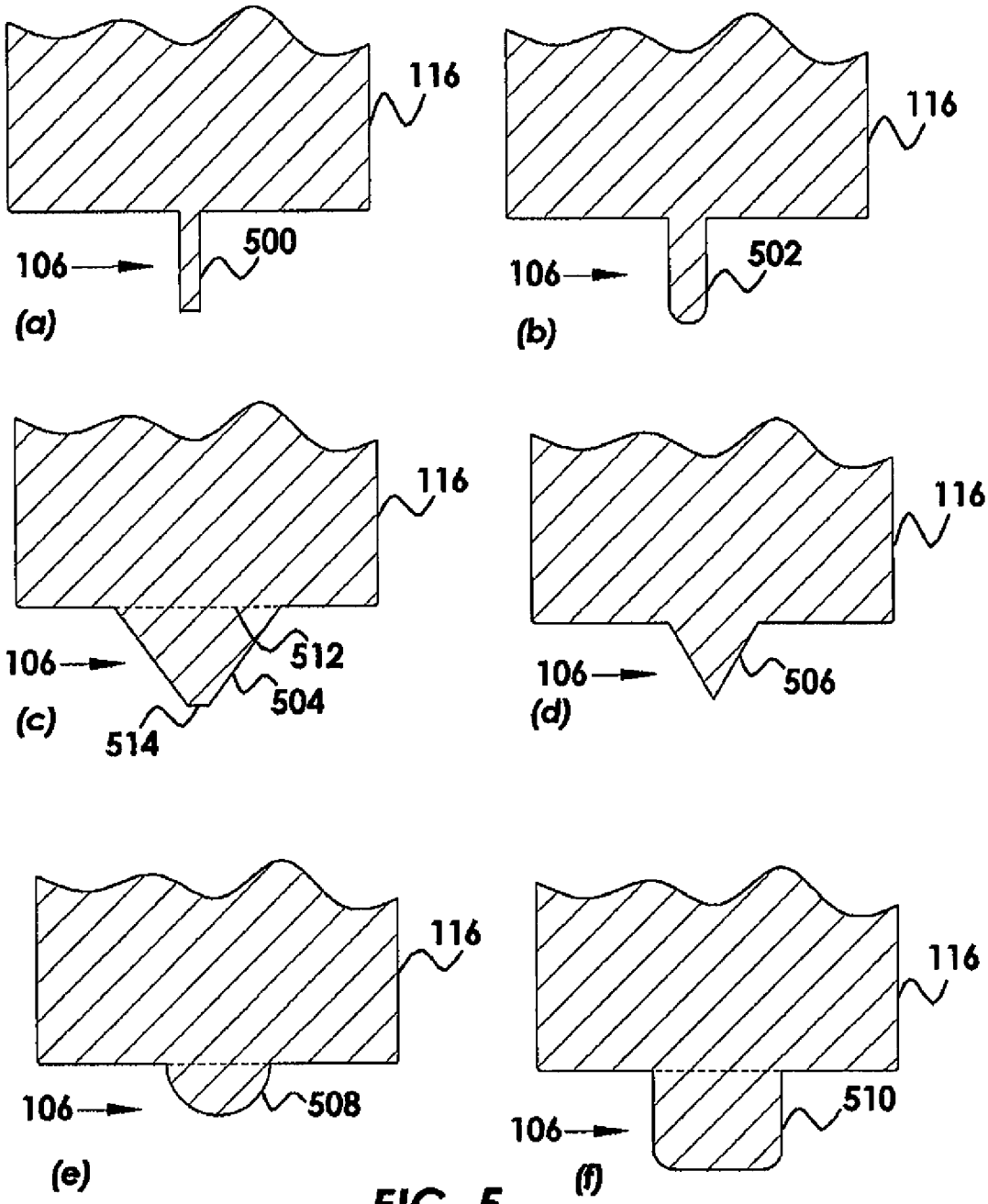
FIGS. 5a-5f show planar cross-section views of some embodiments of the self-cleaning skate according to the present invention.

FIGS. 4a-4c show planar views the self-cleaning skate according to the present invention. In FIG. 4a, a self-cleaning skate 106 is depicted that has a generally square front end 200, a generally round back end 202 and a generally flat middle section 204 therebetween. FIG. 4b depicts another embodiment of the invention with the generally round back end 202 of the self-cleaning skate 106 having a variable radius, or multiple radii, depicted here having a first radius R1 and a second radius R2 in this embodiment. Depicted in FIG. 4c is an end planar view of the self-cleaning skate 106 connected perpendicularly to bottom of the contact tip 116 where shown are the skate width 400, skate height 402 and the skate length 404 (see FIG. 4a). According to one embodiment of the invention, the self-cleaning skate 106 has a height 402 up to ½ of the skate length 404 and a skate width 400 up to ⅙ of the skate length 404, and the skate width 400 is narrower than the contacting tip width 406. The self-cleaning skate 106 may have many different cross-section geometries. FIGS. 5a-5e show planar views of some cross-section embodiments of the self-cleaning skate according to the present invention. FIG. 5a depicts box-shape cross-section 500, FIG. 5b depicts a U-shape cross-section 502, FIG. 5c depicts a parallelogram-shape cross-section 504, FIG. 5d depicts a V-shape cross-section 506, FIG. 5e depicts a semi-circular shape cross-section 508, and FIG. 5f depicts a box-shape having rounded edges 510. The parallelogram cross-section 504 has a first parallel side 512 connected to the bottom of the contact tip 116 and a second parallel side 514 for contacting the conductive pad (not shown), where the first parallel side 512 is larger than the second parallel side 514. The cross-sections depicted here are a small sample of the many possible cross-section geometries that may be used with the current invention to obtain the desired results of scrubbing and testing the conductive pads 108.

Figure 6:
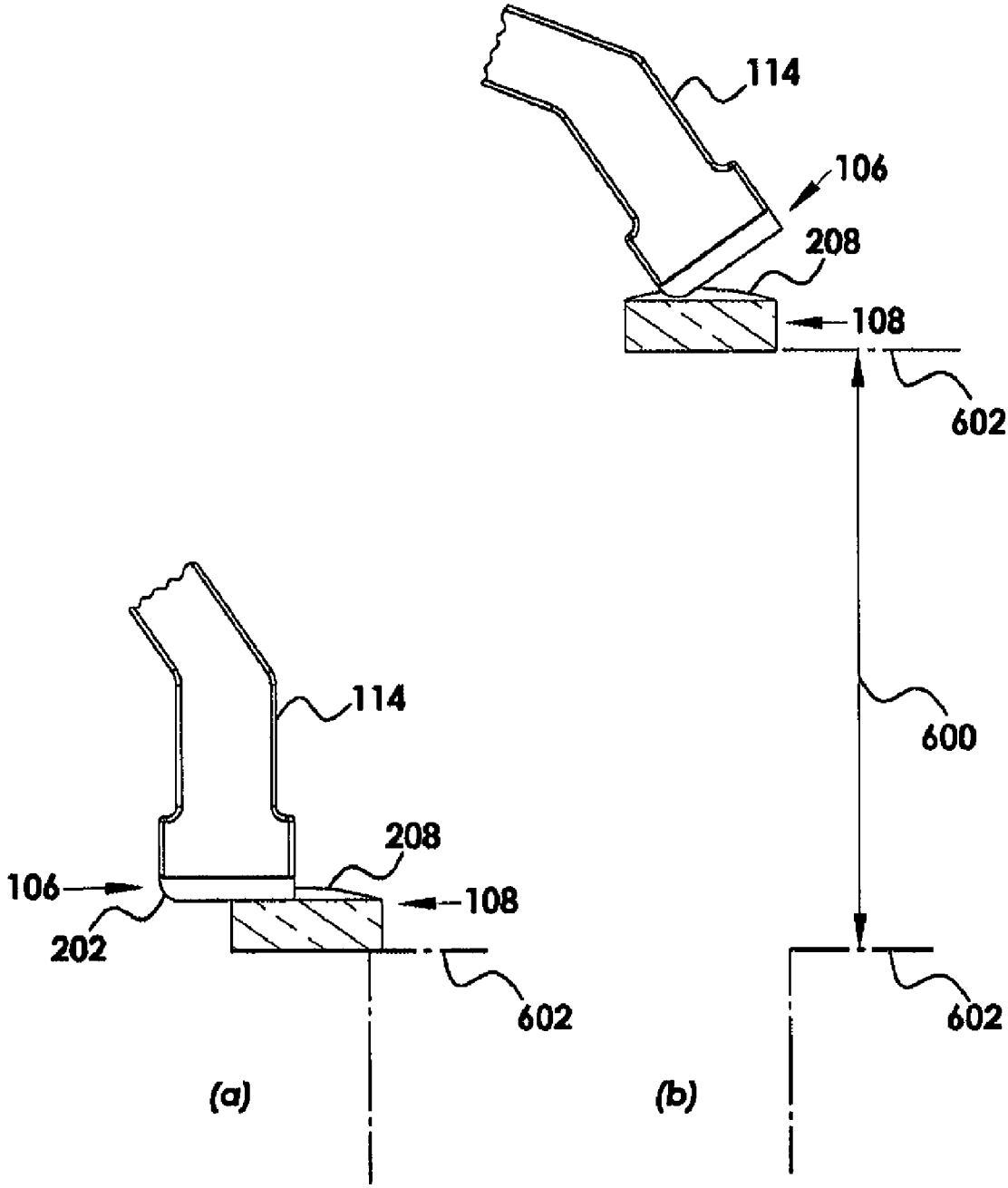
FIGS. 6a-6b show planar views of the overdrive of the conductive pad operating on the probe according to the present invention.

FIGS. 6a and 6b show planar views of the overdrive of the conductive pad operating on the probe according to the present invention. Depicted here, is the self-cleaning skate 108, according to one embodiment of the current invention, that utilizes the round back end 202 to smoothly scrub across the conductive pad 108 when subject to overdrive motion 600 to scrub debris 208 while not breaching the conductive pad 108. Overdrive motion 600 can range from 1-5 mil. In FIG. 6a, the skate 106 is positioned with the center of the flat middle section 204 located near an edge of the conductive pad 108, where the skate 106 is shown to contact the pad 108.

Depicted in FIG. 6b is an overdrive motion 600 applied to the conductive pad 108, where dashed lines 602 are provided to show a relative overdrive displacement of the conductive pad 108. One benefit of the round back end 202 is that it averts the skate 106 from binding in the debris 208 when the overdrive motion 600 is applied, preventing the probe 106 from unpredictably releasing from the debris 208 and springing off of the pad 108, which is undesirable. Further, the added linear distance along the bottom surface of the skate 106 attained by having the round back end 202 provides improved tolerance to overdrive 600.

The current invention improves the skate 106 response to overdrive motion 600 of the conductive pad 108, where movement of the skate 106 having the generally round back end 202 allows the skate 106 to smoothly scrub across the conductive pad 108. A probe end not having the features according to the current invention is known to become caught in the debris 208 while the overdrive motion 600 continues, thus causing the probe arm to build up potential energy. The consequence of this undesirable state is the potential energy eventually surpasses the debris strength and the skate releases across the conductive pad 108, rapidly and without control, swinging beyond the conductive pad 108 thus potentially damaging the skate 106 and/or the pad 108.

Figure 7:
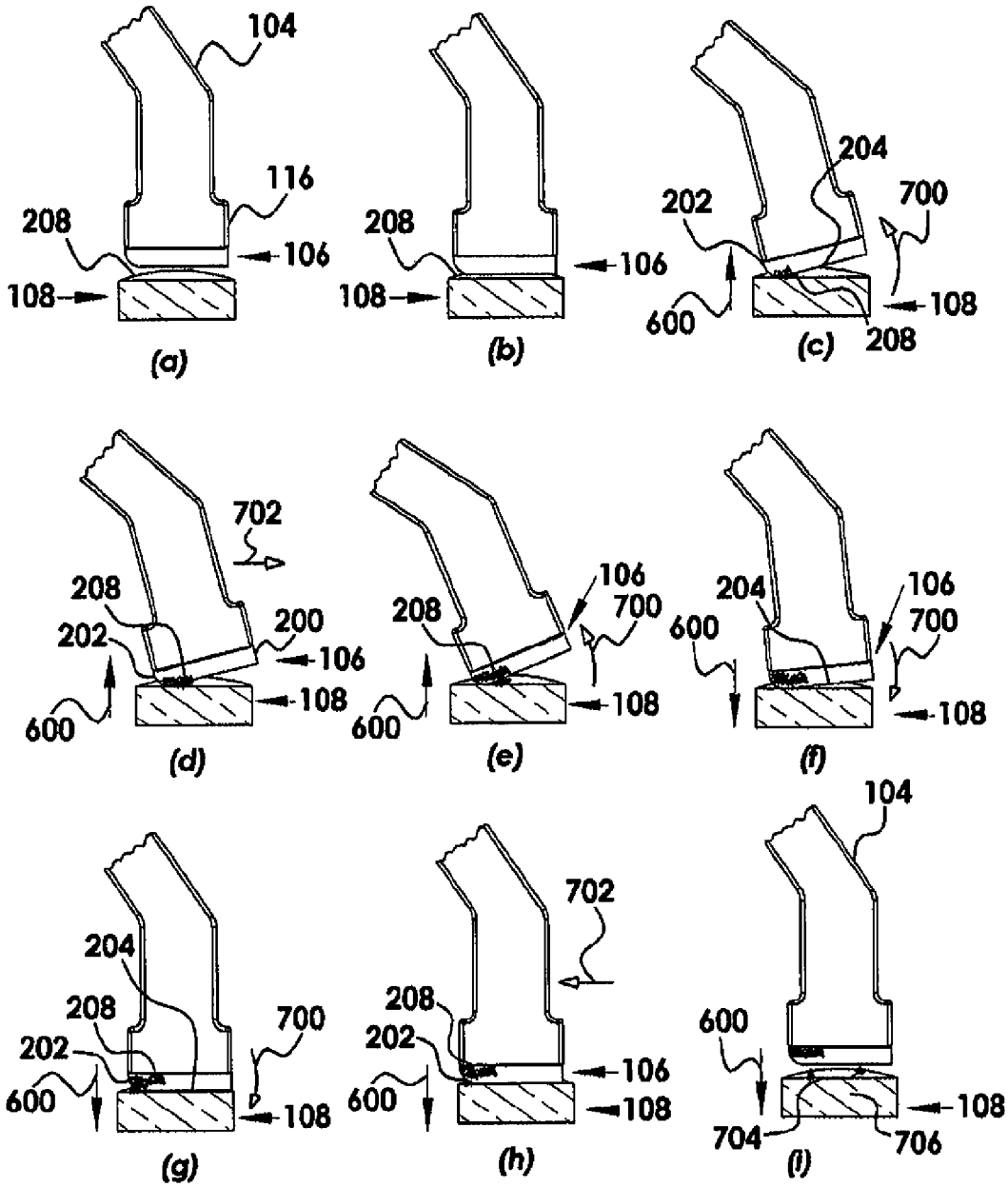
FIGS. 7a-7i show a sequence of planar partial cutaway views of the self-cleaning skate scrubbing across a conductive pad according to the present invention.
Figure 9:
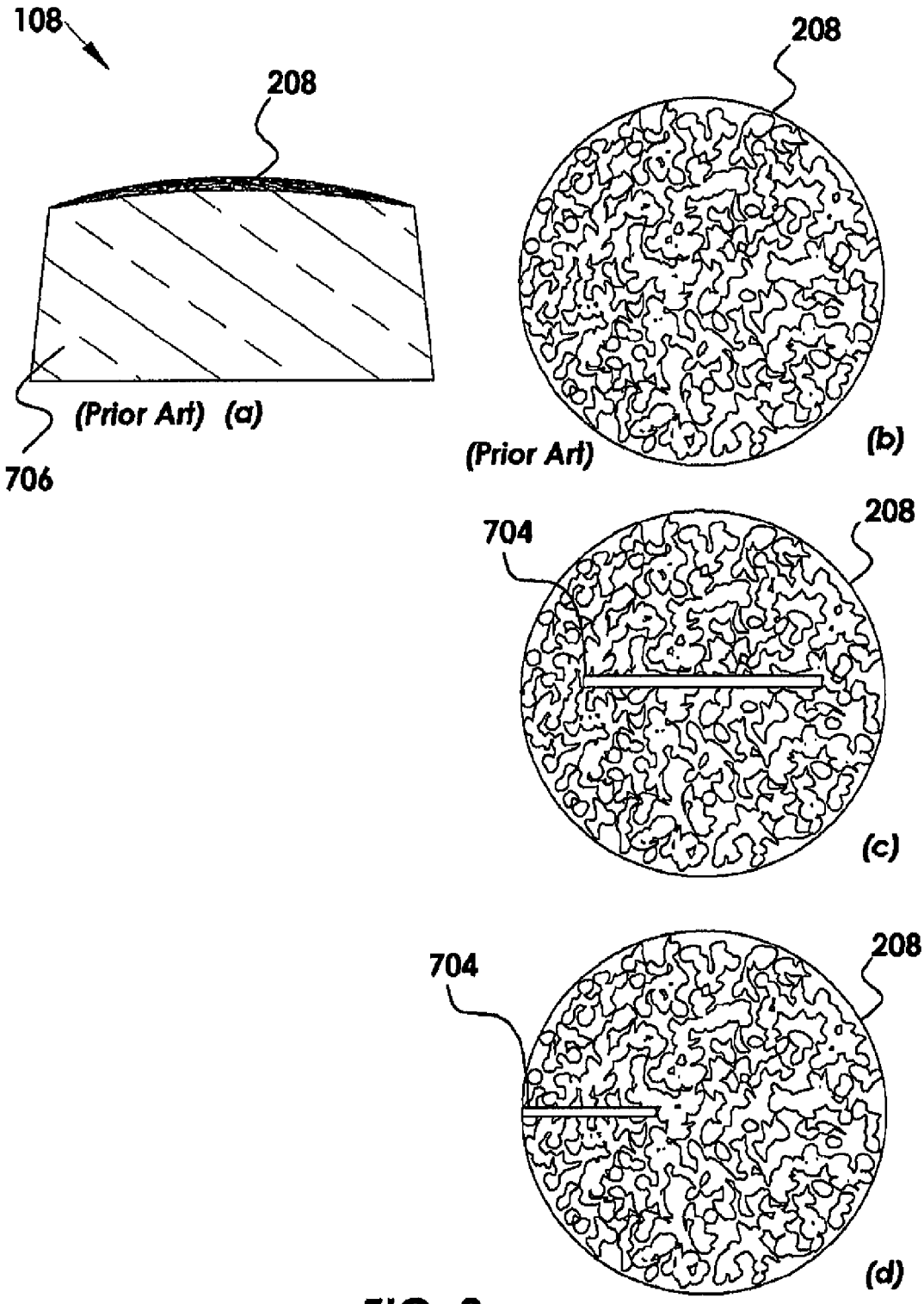
FIG. 9a-9d show planar views of a conductive pad before and after scrubbing.

FIGS. 7a-7i show a sequence of planar partial cutaway views of the self-cleaning skate 106 that scrubs a channel 704 (see FIG. 7i) in the conductive pad according to the present invention. Depicted in FIG. 7a is the probe 104 having a contact tip 116 with the self-cleaning skate 106 attached at the bottom and positioned above the conductive pad 108. The conductive pad 108 is depicted in a cutaway view for illustrative purposes, where a layer of granular debris 208, such as a non-conductive oxide layer, is depicted as a convex shape on top of the conductive pad 108 (see FIG. 9 for drawing of the pad and granular debris). The conductive pad 108 is raised, or translated, to cause the self-cleaning skate 106 to engage the layer of debris 208 of the conductive pad 108, as depicted in FIG. 7b. Once engaged, a test current (i) is applied to the probe and the conductive pad 108 is provided an overdrive motion 600 causing the skate 106 to scrub the debris 208 from the conductive pad 108 and clean the debris 208 from the bottom of the skate 106 as illustrated in this sequence. FIG. 7c-7e depict the response of the probe 104 when subject to overdrive motion 600 from the conductive pad 108, where the probe 114 flexes and causes the contact tip 116 to rotate 700 and form an angle between the skate middle section 204 and a horizontal plane on the pad 108 while engaging the round back end 202 with the conductive pad 108. Overdrive motion 600 is continued in FIGS. 7d and 7e to induce a horizontal translational motion 702 of the skate 106 in a direction from the back end 202 towards the front end 200 across the conductive pad 108 while the skate middle section 204 is further rotated 700 with respect to the horizontal plane. In this exemplary sequence, debris 208 is displaced along the skate 106 and moved around the round back end 202 to a position on the skate 106 that is away from the conductive pad 108. By reversing the overdrive motion 600 to the conductive pad 108, the skate 106 moves in a manner such that the skate middle section 204 rotates 700 from the angle to approximately the horizontal position, as depicted in FIG. 7f, where the skate flat middle section 204 is in contact with the conductive pad 108. Shown in FIG. 7g, the debris 208 on the skate back end 202 moves to a position away from the conductive pad 108 as the flat middle section 204 is further rotated 700 down to a horizontal position. Continuing the reverse overdrive motion 600 causes the skate 106 to translate 702 in an opposite direction along the horizontal position on the conductive pad 108, depicted in FIG. 7h, and further moves the debris 208 around the round back end 202 to a position on the skate 106 that is away from the conductive pad 108. Finally, the reverse overdrive motion 600 of the conductive pad 108 continues to cause the probe 104 to disengage from the conductive pad, as depicted in FIG. 7i, where this scrubbing method improves overdrive 600 control by making the skate 106 movement less sensitive to the overdrive 600. Accordingly, the oxidation layer 208 is removed without breaching the conductive pad 108 and the debris 208 is displaced from the conductive pad 108 along the skate 106 to a position away from the pad 108. Further depicted in FIG. 7i is a scrub channel 704 near the pad center having a furrow-buildup of the debris 208 to illustrate how it responds to scrubbing from the self-cleaning skate according to the current invention, where the scrub channel 704 that exposes the conductive metal 706 of the conductive pad 108.

Figure 8:
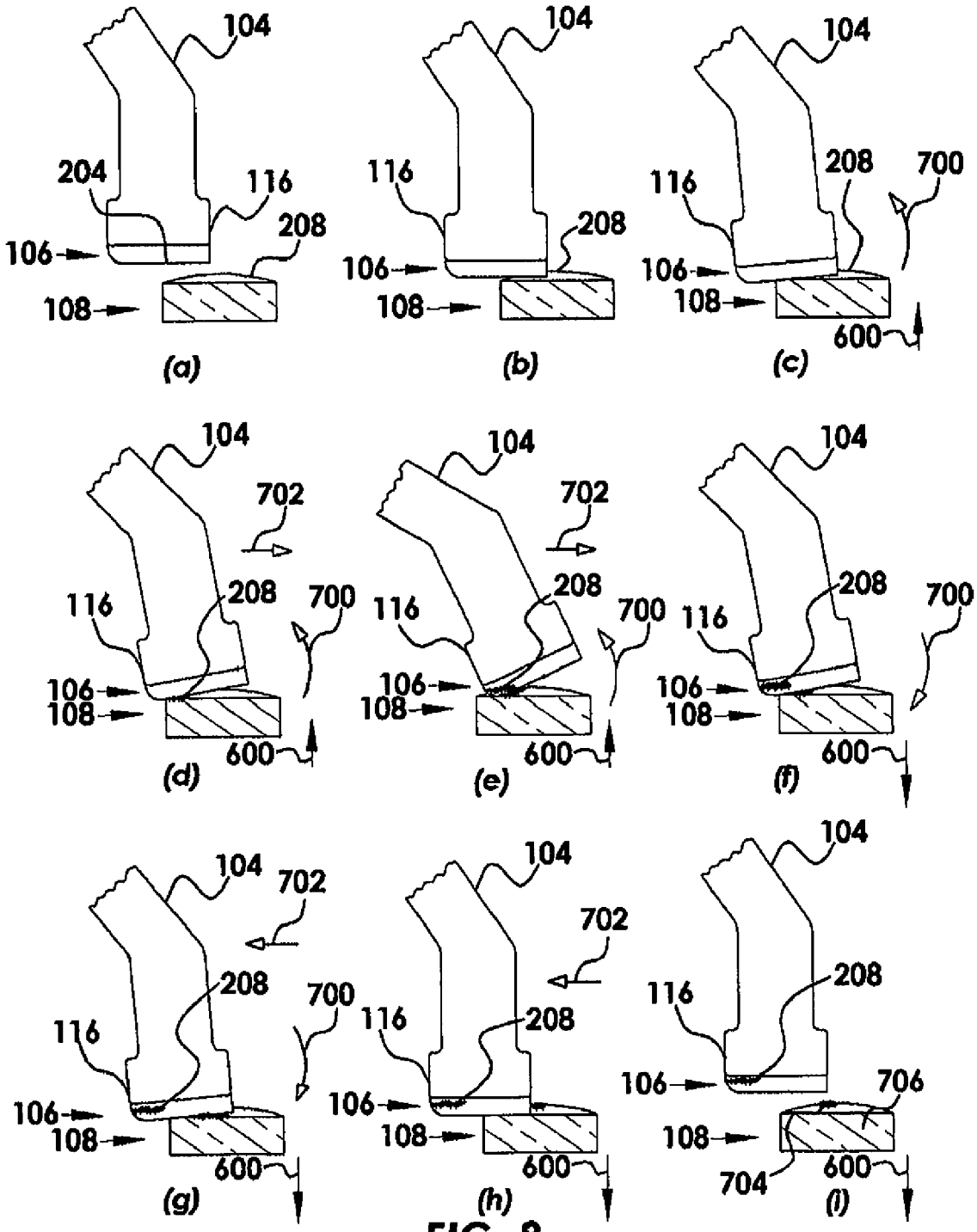
FIGS. 8a-8i show a sequence of planar partial cutaway views of the self-cleaning skate scrubbing across a conductive pad with initial the skate position on a pad edge according to the present invention.

FIGS. 8a-8i show planar views of the overdrive motion 600 of the conductive pad 108 operating on the probe 114 having a self-cleaning skate 106 according to the present invention. Depicted in FIG. 8a is the probe 114 having a contact tip 116 with the self-cleaning skate 106 attached at the bottom. In this example, the skate 106 is positioned with the skate middle section 204 above the edge of the conductive pad 108. The conductive pad 108 is depicted in a cutaway view for illustrative purposes, where a layer of granular debris 208 is depicted on top of the conductive pad 108 (see FIG. 9 for drawing of the pad and granular debris). The conductive pad 106 is moved to cause the self-cleaning skate 106 to engage the debris layer 208 of the conductive pad 108, as depicted in FIG. 8b. Once engaged, the conductive pad 108 is provided an overdrive motion 600 causing the skate 106 to scrub the debris 208 from the conductive pad 108 and clean the debris 208 from the skate 106. FIGS. 8c-8e depict the response of the probe 114 when subject to overdrive motion 600 from the conductive pad 208 moving in an upward direction, where the probe 114 flexes and causes the contact tip 116 to rotate 700 and form an angle between the skate middle section 204 and a horizontal plane while engaging the round back end 202 with the conductive pad 108. Here, the square front end 200 is on the convex shape of the conductive pad 108 while the round back end 202 is off the pad 108. This way, as the probe 114 undergoes deflection, it rocks on the edge of the pad 108 to provide a highly concentrated force that helps the skate 106 penetrate the debris 208 (see FIG. 8d). Overdrive motion 600 is continued in FIG. 8e to induce a translation 702 of the skate 106 in a direction from the back end 202 towards the front end 200 across the conductive pad 108 while the skate middle section 204 further rotates 700 with respect to the horizontal plane. In this sequence, debris 208 is displaced along the skate 106 and moved around the round back end 202 to a position on the skate 106 that is away from the conductive pad 108. By reversing the overdrive motion 600 of the conductive pad 108, the skate 106 rotates 700 in a manner such that the skate middle section 204 forms a smaller angle with respect to the horizontal plane, while simultaneously translating 702 in a direction from the front end 200 towards the back end 202 across the conductive pad 108 as depicted in FIGS. 8f and 8g, where the skate flat middle section 204 is in contact with the conductive pad. The debris 208 on the skate back end 202 moves to a position away from the conductive pad 108 as the flat middle section 204 is further rotated down to a horizontal position. Depicted in FIG. 8h is the skate 106 translating 702 with the middle section 204 in a horizontal orientation, and the reverse overdrive motion 600 of the conductive pad 108 continues to cause the probe 114 to disengage from the conductive pad, as depicted in FIG. 8i. The sequence described here illustrates how the self-cleaning skate 106 improves overdrive control by making the skate 106 movement less sensitive to the overdrive. Accordingly, the debris layer 208 is removed without breaching the conductive pad 108, where the debris 208 is displaced from the conductive pad 108 to a position on the skate 106 that is away from the pad 108. Further depicted in FIG. 8i is a scrub channel 600 that exposes the conductive metal 706 of the conductive pad 108.

By selecting the initial position of the skate 106 relative to the pad 108, the scrub channel 600 can be made in all locations on the surface of the conductive pad 108, where the invention provides better control of the motion of the skate 106 across the pad 108, while preserving the integrity of the conductive pad 108 and the skate 106. FIGS. 9a-9d depict planar views of a conductive pad 108 before and after scrubbing. FIG. 9a shows a side planar view of a typical conductive pad 108 having a splayed-cylindrical conductive metal base 706 and a layer of debris 208, such as a non-conductive oxide layer, on a convex pad 108. FIG. 9b shows a top planar view of a typical conductive pad 108 having a generally granular surface of debris 208 to be scrubbed for enabling conduction of the test signal (i) from the skate 106 to the pad 108. FIG. 9c illustrates a scrub channel 704 made across the center of the pad 108 as per the description related to FIG. 7 above, and FIG. 9d illustrates a scrub channel 704 made near the edge of the pad 108 as per the description related to FIG. 8 above. Though the drawings of the conductive pad 108 are depicted to have a general convex shape, in practice the surface pad 108 can be an irregular shape. The self-cleaning skate 106 according to the embodiments described are able to provide useful scrub channels 704 in these irregular shapes and in numerous pad locations to provide conduction for the test signal (i) with tolerance to overdrive motion 600 and without breaching the pad 108, where the thickness of the pad may be only slightly more thick than the debris layer.

Figure 10:
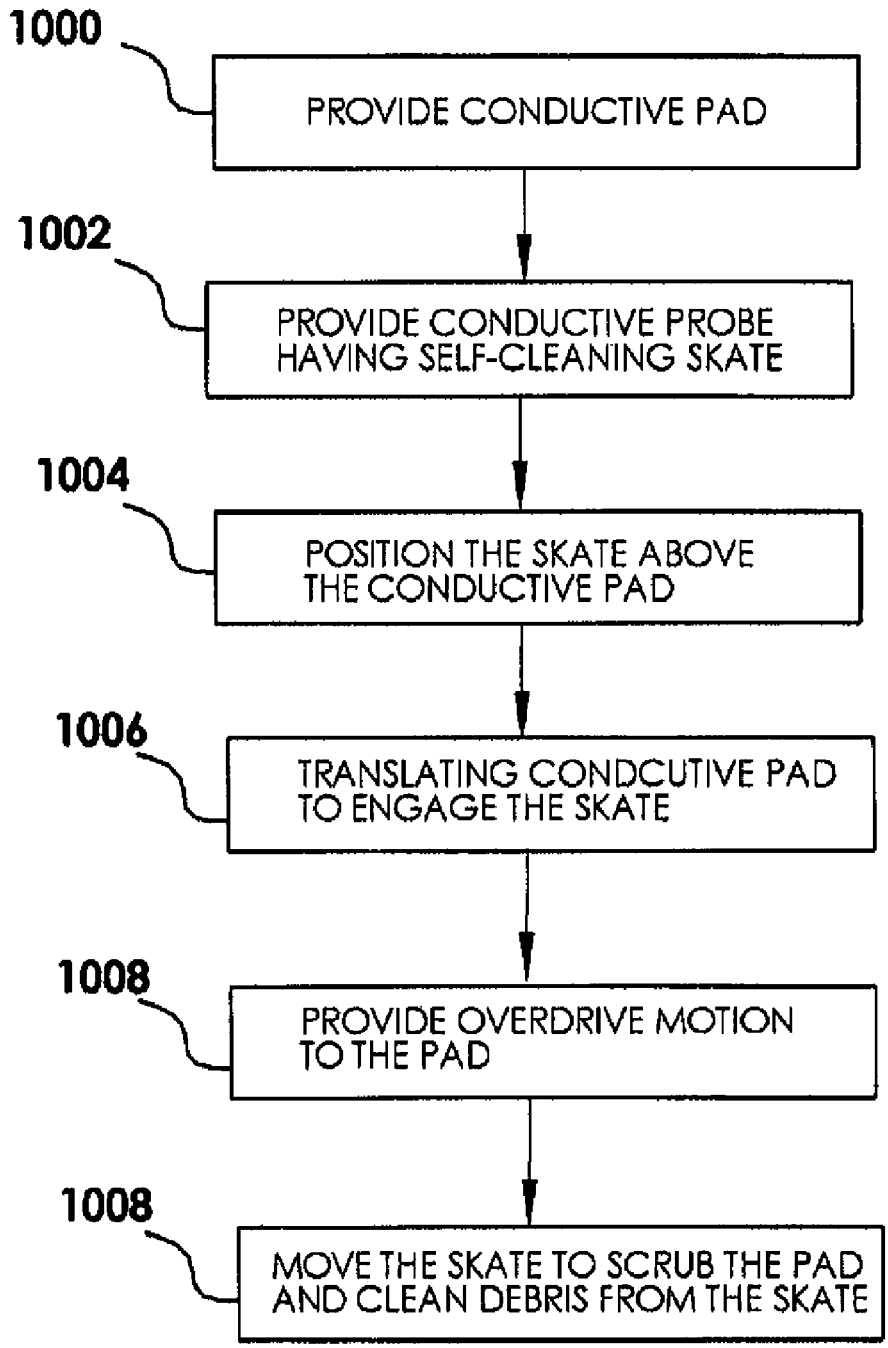
FIG. 10 is a flow-chart that shows the steps for using the self-cleaning skate according to the present invention.

FIG. 10 is a flow diagram depicting the steps for using the self-cleaning skate according to the present invention. The steps include providing a conductive pad 1000, providing a conductive probe having a conductive self-cleaning skate with a square front end, a round back end and a flat middle section 1002, positioning the skate above the conductive pad 1004, translating the conductive pad to engage the skate 1006, and providing overdrive motion to the pad 1008 and moving the skate to scrub debris from the pad and clean debris from the skate 1008, wherein the method improves overdrive control by making the scrubbing and the cleaning less sensitive to the overdrive, where the debris layer is removed without breaching the conductive pad and debris is displaced from the conductive pad to a position on the skate that is away from the pad.

The present invention has now been described in accordance with several exemplary embodiments, which are intended to be illustrative in all aspects, rather than restrictive. Thus, the present invention is capable of many variations in detailed implementation, which may be derived from the description contained herein by a person of ordinary skill in the art. All such variations are considered to be within the scope and spirit of the present invention as defined by the following claims and their legal equivalents.

What is claimed is:

1. A probe for engaging a conductive pad, said probe comprising:

a. a probe contact end for receiving a test current;

b. a probe retention portion below said contact end;

c. a block holding said retention portion;

d. a probe arm below said retention portion;

e. a probe contact tip below said arm; and f. a generally planar self-cleaning skate disposed perpendicular below said contact tip having a generally square front end, a generally round back end and a generally flat middle section therebetween, wherein said conductive pad of generally convex shape and having a granular non-conductive surface layer of debris moves to engage said skate, whereby an overdrive motion is applied to said conductive pad thereby causing said skate to move across said conductive pad to scrub non-conductive debris from said conductive pad and displace said debris along said skate and move said debris near said skate round back end to a position on said skate that is away from said conductive pad.

2. The probe according to claim 1, wherein said non-conductive surface layer of debris is a non-conductive oxide.

3. The probe according to claim 1, wherein said skate comprises a skate height up to ½ of a skate length and a skate width up to ⅙ of said skate length.

4. The probe according to claim 3, wherein said self-cleaning skate width is narrower than a width of said contacting tip.

5. The probe according to claim 1, wherein said skate has a cross-section selected from a group consisting of U-shape, semi-circular shape, V-shape, box-shape, and parallelogram-shape.

6. The probe according to claim 5, wherein said parallelogram cross-section has a first parallel side connected to said contact tip and a second parallel side for contacting said conductive pad, whereby said first parallel side is larger than said second parallel side.

7. The probe according to claim 5, wherein said box-shape cross-section comprises a first horizontal side connected to said contact tip and a second horizontal side for contacting said conductive pad, whereby said second horizontal side further comprises radii at each edge of said second horizontal side.

8. The probe according to claim 1, wherein said probe arm comprises a base arm below said retention portion, a knee below said base arm, and a reverse arm below said knee, whereby said contact tip is below said reverse arm and said self-cleaning skate is below said contact tip.

9. The probe according to claim 1, wherein said skate round back end has a radius with a size up to a length of said skate height.

10. The probe according to claim 1, wherein said round back end is a variable radius back end.

11. The probe according to claim 1, wherein said overdrive motion causes said skate to pivot, whereby said middle section forms an angle up to 35 degrees with respect to a horizontal plane while said round back end is engaged with said conductive pad.

12. The probe according to claim 1, wherein reversing said overdrive motion causes said skate to move in a reverse direction, whereby a. said skate moves from an angle to approximately a horizontal position while maintaining said engagement with said conductive pad;

b. said skate translates along said horizontal position in a direction towards said skate back end, whereby said debris is further displaced along said round back end and away from said conductive pad; and c. said conductive pad moves away from said skate to disengage said probe from said conductive pad.

13. The probe according to claim 1, wherein in an extended overdrive motion beyond said overdrive motion is applied to said conductive pad causing said probe to move in a manner to further displace said displaced debris away from said conductive pad.

14. The probe according to claim 13, wherein said extended overdrive motion is applied after at least two touch down cycles.

15. The probe according to claim 1, wherein said conductive pad moves between 1-5 mil.

16. The probe according to claim 1, wherein said conductive pad is a cleaning sheet having debris adhesion properties for removing said debris from said skate.

17. The probe according to claim 1, wherein said self-cleaning skate length is aligned along a scrub direction.

18. A conductive probe for engaging a conductive pad comprising:

a. a contact end for receiving a test current;

b. a retention portion below said contact end;

c. a block holding said retention portion;

d. a base arm portion below said retention portion;

e. a knee below said base arm portion;

f. a reverse arm portion below said knee;

g. a contact tip below said reverse arm portion; and h. a generally planar self-cleaning skate disposed perpendicular below said contact tip having a generally square front end, a generally round back end and a generally flat middle section therebetween, wherein said conductive pad is of generally convex shape and having a granular non-conductive surface layer of debris moves to engage said skate, whereby an overdrive motion is applied to said conductive pad thereby causing said skate to move across said conductive pad to scrub said debris from said conductive pad and displace said debris along said skate and move said debris near said skate round back end to a position on said skate that is away from said conductive pad.

19. A method of using a self-cleaning skate comprising:

a. providing a conductive pad having a generally convex shape and a granular non-conductive surface layer of debris;

b. providing a conductive probe for engaging said conductive pad, the conductive probe comprising:

i. a contact end for receiving a test current;

ii. a retention portion below said contact end iii. a block holding said retention portion;

iv. a probe arm below said retention portion;

v. a probe contact tip below said arm; and vi. a generally planar self-cleaning skate disposed perpendicular below said contact tip having a generally square front end, a generally round back end and a generally flat middle section therebetween;

c. positioning said skate above said conductive pad;

d. translating said conductive pad causing said skate to engage said conductive pad;

e. providing an overdrive motion to said conductive pad causing said skate to scrub said debris to expose conductive material of said conductive pad and clean said debris from said skate wherein said cleaning comprises:

i. forming an angle of said skate middle section with respect to a horizontal plane while engaging said round back end with said conductive pad;

ii. inducing a translation motion of said skate back end in a direction towards said skate front end across said conductive pad while said skate middle section is further angled with respect to said horizontal plane;

iii. displacing said debris along said skate and moving said debris around said round back end to a position on said skate that is away from said conductive pad;

iv. reversing said overdrive motion to said pad causing said skate middle section to move from said angle to approximately said horizontal position, wherein said skate flat middle section is in contact with said conductive pad whereby said debris on said skate back end moves to a position away from said conductive pad; and v. translating said skate along said horizontal position and further moving said debris around said round back end to a position on said skate that is away from said conductive pad; and vi. translating said pad to cause said probe to disengage from said conductive pad, wherein said method improves overdrive control by making said scrubbing and said cleaning less sensitive to said overdrive, whereby said non-conductive layer of debris is removed without breaching said conductive pad and debris is displaced from said conductive pad to said skate.

20. The method of claim 19, wherein using said self-cleaning method is accomplished after at least two said engagement cycles.

21. The method of claim 19, wherein said non-conductive layer of debris is a non-conductive oxide layer.

22. The method of claim 19, wherein a current (i) is applied after said self-cleaning skate contacts said conductive pad.

23. The method of claim 19, wherein said probe arm comprises a base arm below said retention portion, a knee below said base arm, and a reverse arm below said knee, whereby said contact tip is below said reverse arm and said self-cleaning skate is below said contact tip.

24. The method of claim 19, wherein positioning said self-cleaning skate above said pad comprises disposing said skate at an approximate center location of said flat middle end above an edge of said conductive pad.

25. The method of claim 24, wherein engaging said conductive pad comprises engaging said approximate center of said skate with said conductive pad edge.

*26. A probe for engaging a conductive pad, said probe comprising:*

*a contact end disposed on one end of said probe for receiving a test current; and*

*a self-cleaning skate disposed on another end of said probe, said skate comprising a generally square front end, a generally round back end and a generally flat middle section therebetween, wherein said skate engages the conductive pad.*

*27. The probe of claim 26 further comprising a retention portion disposed on said contact end.*

*28. The probe of claim 27 further comprising a block for holding said retention portion.*

*29. The probe of claim 27 further comprising a probe arm disposed on said retention portion.*

*30. The probe of claim 29 wherein said probe arm comprises a base arm below said retention portion, a knee below said base arm, and a reverse arm below said knee, whereby said contact tip is below said reverse arm and said self-cleaning skate is below said contact tip.*

*31. The probe of claim 26 wherein said skate is disposed on a contact tip.*

*32. The probe of claim 26 wherein said self-cleaning skate is generally planar.*

*33. The probe of claim 26 wherein the conductive pad is generally convex shaped.*

*34. The probe of claim 26 wherein the conductive pad moves to engage said skate.*

*35. The probe of claim 26 wherein the conductive pad comprises a non-conductive surface layer of debris.*

*36. The probe of claim 35 wherein said non-conductive surface layer of debris comprises a non-conductive oxide.*

*37. The probe of claim 26 wherein said skate comprises a skate height of up to about ½ of a length of said skate.*

*38. The probe of claim 26 wherein said skate comprises a skate width up to about ⅙ of a length of said skate.*

*39. The probe of claim 26 wherein a width of said skate is narrower than a width of said contact tip.*

*40. The probe of claim 26 wherein said skate comprises a U-shaped cross-section.*

*41. The probe of claim 26 wherein said skate comprises a semi-circular cross-section.*

*42. The probe of claim 26 wherein said skate comprises a V-shaped cross-section.*

*43. The probe of claim 26 wherein said skate comprises a box-shaped cross-section.*

*44. The probe of claim 43 wherein said box-shape comprises rounded edges.*

*45. The probe of claim 26 wherein said skate comprises a parallelogram-shaped cross-section.*

*46. The probe of claim 45 wherein said parallelogram-shape comprises a first parallel side connected to a bottom of a contact tip and a second parallel side for contacting the conductive pad.*

*47. The probe of claim 46 wherein said first parallel side is larger than said second parallel side.*

*48. The probe of claim 26 wherein said skate round back end comprises a radius with a size up to a length of said skate height.*

*49. The probe of claim 26 wherein said round back end comprises a variable radius back end.*

*50. The probe of claim 26 wherein said skate is disposed perpendicular below a contact tip.*

*51. The probe of claim 26 wherein said probe is one of an array of probes.*

*52. The probe of claim 26 wherein the conductive pad comprises a cleaning sheet.*

*53. A probe for engaging a conductive pad, said probe comprising:*

*a contact end disposed on one end of said probe for receiving a test current;*

*a self-cleaning skate disposed on another end of said probe, said skate comprising at least one rounded edge and at least one flat edge blade, wherein said skate engages the conductive pad;*

*said skate comprises a skate height of up to about ½ of a length of said skate; and*

*the conductive pad being generally convex shaped.*

*54. The probe of claim 53 further comprising a retention portion disposed on said contact end.*

*55. The probe of claim 54 further comprising a block for holding said retention portion.*

*56. The probe of claim 54 further comprising a probe arm disposed on said retention portion.*

*57. The probe of claim 56 wherein said probe arm comprises a base arm below said retention portion, a knee below said base arm, and a reverse arm below said knee, whereby said contact tip is below said reverse arm and said self-cleaning skate is below said contact tip.*

*58. The probe of claim 53 wherein said skate is disposed on a contact tip.*

*59. The probe of claim 53 wherein said self-cleaning skate is generally planar.*

*60. The probe of claim 53 wherein the conductive pad moves to engage said skate.*

*61. The probe of claim 53 wherein the conductive pad comprises a non-conductive surface layer of debris.*

*62. The probe of claim 61 wherein said non-conductive surface layer of debris comprises a non-conductive oxide.*

*63. The probe of claim 53 wherein said skate comprises a skate width up to about ⅙ of a length of said skate.*

*64. The probe of claim 53 wherein a width of said skate is narrower than a width of said contact tip.*

*65. The probe of claim 53 wherein said skate comprises a U-shaped cross-section.*

*66. The probe of claim 53 wherein said skate comprises a semi-circular cross-section.*

*67. The probe of claim 53 wherein said skate comprises a V-shaped cross-section.*

*68. The probe of claim 53 wherein said skate comprises a box-shaped cross-section.*

*69. The probe of claim 68 wherein said box-shape comprises rounded edges.*

*70. The probe of claim 53 wherein said skate comprises a parallelogram-shaped cross-section.*

*71. The probe of claim 70 wherein said parallelogram-shape comprises a first parallel side connected to a bottom of a contact tip and a second parallel side for contacting the conductive pad.*

*72. The probe of claim 71 wherein said first parallel side is larger than said second parallel side.*

*73. The probe of claim 53 wherein said rounded edge comprises a radius with a size up to a length of said skate height.*

*74. The probe of claim 53 wherein said rounded edge comprises a variable radius back end.*

*75. The probe of claim 53 wherein said skate is disposed perpendicular below a contact tip.*

*76. The probe of claim 53 wherein said probe is one of an array of probes.*

*77. The probe of claim 53 wherein the conductive pad comprises a cleaning sheet.*

*78. A probe for engaging a conductive pad, said probe comprising:*

*a contact end disposed on one end of said probe for receiving a test current;*

*a self-cleaning skate disposed on another end of said probe, said skate comprising at least one rounded edge*

*and at least one flat edge blade, wherein said skate engages the conductive pad;*

*said skate comprises a skate width of up to about 1/6 of a length of said skate; and*

*the conductive pad being generally convex shaped.*

*79. A probe for engaging a conductive pad, said probe comprising:*

*a contact end disposed on one end of said probe for receiving a test current;*

*a self-cleaning skate disposed on another end of said probe, said skate comprising at least one rounded edge and at least one flat edge blade, wherein said skate engages the conductive pad;*

*said skate comprises a U-shaped cross-section; and*

*the conductive pad being generally convex shaped.*

*80. A probe for engaging a conductive pad, said probe comprising:*

*a contact end disposed on one end of said probe for receiving a test current;*

*a self-cleaning skate disposed on another end of said probe, said skate comprising at least one rounded edge and at least one flat edge blade, wherein said skate engages the conductive pad;*

*said skate comprises a semi-circular cross-section; and*

*the conductive pad being generally convex shaped.*

*81. A probe for engaging a conductive pad, said probe comprising:*

*a contact end disposed on one end of said probe for receiving a test current;*

*a self-cleaning skate disposed on another end of said probe, said skate comprising at least one rounded edge and at least one flat edge blade, wherein said skate engages the conductive pad;*

*said skate comprises a V-shaped cross-section; and*

*the conductive pad being generally convex shaped.*

*82. A probe for engaging a conductive pad, said probe comprising:*

*a contact end disposed on one end of said probe for receiving a test current;*

*a self-cleaning skate disposed on another end of said probe, said skate comprising at least one rounded edge and at least one flat edge blade, wherein said skate engages the conductive pad;*

*said skate comprises a box-shaped cross-section; and*

*the conductive pad being generally convex shaped.*

*83. A probe for engaging a conductive pad, said probe comprising:*

*a contact end disposed on one end of said probe for receiving a test current;*

*a self-cleaning skate disposed on another end of said probe, said skate comprising at least one rounded edge and at least one flat edge blade, wherein said skate engages the conductive pad;*

*said skate comprises a parallelogram-shaped cross-section; and*

*the conductive pad being generally convex shaped.*

*84. A probe for engaging a conductive pad, said probe comprising:*

*a contact end disposed on one end of said probe for receiving a test current;*

*a self-cleaning skate disposed on another end of said probe, said skate comprising at least one rounded edge and at least one flat edge blade, wherein said skate engages the conductive pad;*

*said rounded edge comprises a radius with a size up to a length of said skate height; and*

*the conductive pad being generally convex shaped.*

*85. A probe for engaging a conductive pad, said probe comprising:*

*a contact end disposed on one end of said probe for receiving a test current;*

*a self-cleaning skate disposed on another end of said probe, said skate comprising at least one rounded edge and at least one flat edge blade, wherein said skate engages the conductive pad;*

*said rounded edge comprises a variable radius back end; and*

*the conductive pad being generally convex shaped.*

* * * * *